United States Patent [19]

Ando et al.

[11] Patent Number: 5,576,138
[45] Date of Patent: Nov. 19, 1996

[54] POSITIVE-WORKING NAPHTHO QUINONE DIAZIDE SULFONIC ACID ESTER PHOTORESIST COMPOSITION CONTAINING SELECT COMBINATION OF ADDITIVES

[75] Inventors: Yoshito Ando; Atsushi Sawano, both of Fujisawa; Nobuo Tokutake, Kawasaki; Hidekatsu Kohara; Toshimasa Nakayama, both of Chigasaki, all of Japan

[73] Assignee: Tokyo Ohka Kogyo Co., Ltd., Japan

[21] Appl. No.: 423,722

[22] Filed: Apr. 18, 1995

[30] Foreign Application Priority Data

Apr. 22, 1994  [JP]  Japan .................................. 6-085106

[51] Int. Cl.$^6$ ........................................ G03F 7/023
[52] U.S. Cl. .............................. 430/191; 430/192
[58] Field of Search ......................... 430/190, 191, 430/192, 193

[56] References Cited

U.S. PATENT DOCUMENTS

| | | | |
|---|---|---|---|
| 4,654,292 | 3/1987 | Oie et al. | 430/197 |
| 4,738,915 | 4/1988 | Komine et al. | 430/191 |
| 5,019,479 | 5/1991 | Oka et al. | 430/172 |
| 5,110,706 | 5/1992 | Yumoto et al. | 430/191 |
| 5,401,617 | 3/1995 | Kato et al. | 430/326 |
| 5,478,692 | 12/1995 | Doi et al. | 430/191 |

FOREIGN PATENT DOCUMENTS 61-241759  10/1986  Japan .
5-119474   5/1993  Japan .

*Primary Examiner*—Janet C. Baxter
*Assistant Examiner*—Christopher G. Young
*Attorney, Agent, or Firm*—Wenderoth, Lind & Ponack

[57] ABSTRACT

Disclosed is a positive-working photoresist composition used in the photolithographic patterning work for the manufacture of various electronic devices such as VLSIs having improved characteristics, in particular, in respect of the halation-preventing effect. In addition to the conventional ingredients of (a) an alkali-soluble novolac resin as a film-forming agent and (b) a naphthoquinonediazide group-containing compound as a photosensitizing agent, the composition is formulated by the admixture of a specific amount of (c) a halation-preventing agent which is a combination of, one, (c1) a 4,4'-bis(dialkylamino) benzophenone compound and, the other, (c2) a compound selected from the group consisting of polyhydroxy benzophenone compounds, amino- and hydroxy-containing benzophenone compounds and 4-pyrazolylazo compounds in a specific weight proportion of (c1):(c2).

11 Claims, No Drawings

POSITIVE-WORKING NAPHTHO QUINONE DIAZIDE SULFONIC ACID ESTER PHOTORESIST COMPOSITION CONTAINING SELECT COMBINATION OF ADDITIVES

BACKGROUND OF THE INVENTION

The present invention relates to a novel positive-working photoresist composition or, more particularly, to a high-sensitivity positive-working photoresist composition capable of giving a finely patterned resist layer in a high resolution and excellent in the cross sectional profile of the patterned layer and heat resistance with excellent characteristics of focusing depth latitude and exposure dose latitude even on a surface having ruggedness or level differences and high reflectivity as well as good halation-preventing effect.

As is known, the method of photolithographic patterning is a well established technology in the process for the manufacture of semiconductor devices such as ICs, LSIs and the like and liquid-crystal devices such as liquid-crystal display panels and the like. The photolithographic patterning work is conducted by first forming a layer of a so-called photoresist composition which is pattern-wise exposed to actinic rays such as ultraviolet light to form a latent image of the pattern followed by development. Of the two types of photoresist compositions including positive-working and negative-working ones, the positive-working photoresist compositions are preferred in most cases to the negative-working ones and the essential ingredients in a typical positive-working photoresist composition under practical use include an alkali-soluble resin as a film-forming ingredient and a quinone diazide group-containing compound as a photosensitizing ingredient.

The alkali-soluble resin as a film-forming ingredient in a positive-working photoresist composition most widely used in practical applications is a novolac resin in respect of the advantageous properties thereof that the resin is soluble in an alkaline aqueous solution as a developer solution without swelling to exhibit excellent developability and the resist layer formed therefrom has excellent heat resistance to withstand plasma etching with the patterned resist layer as an etching mask.

The quinone diazide group-containing compound as the photosensitive ingredient is very unique because the compound in itself has an activity to suppress the alkali-solubility of the novolac resin while, when irradiated pattern-wise with actinic rays including electromagnetic waves such as ultra-violet light, e.g., g-line and i-line, and far-ultraviolet light, e.g., excimer laser beams, and corpuscular rays for pattern-wise scanning such as electron beams, the quinone diazide group-containing compound per se is converted into an alkali-soluble form along with promotion of the alkali-solubility of the novolac resin. Thus, a great number of positive-working photoresist compositions comprising a quinone diazide group-containing compound and an alkali-soluble novolac resin and capable of exhibiting a great change in the properties by exposure to actinic rays such as electromagnetic waves and corpuscular rays have been developed and brought under practical applications (see, for example, U.S. Pat. No. 4,377,631, Japanese Patent Kokai No. 62-35349, Japanese Patent Kokai No. 1-142548, Japanese Patent Kokai No. 1-179147 and Japanese Patent Publication No. 3-4897).

Along with the increase year by year in the degree of integration in the semiconductor devices and liquid crystal devices in recent years, the accuracy required in the photolithographic patterning work is so fine as to be in the order of submicrons, half microns or even finer in the manufacture of, for example, VLSIs. Accordingly, the positive-working photoresist composition used therefor must satisfy several requirements that the composition can give a patterned resist layer having high resolution of the patterned images and excellent heat resistance not to cause thermal deformation in the dry etching or the post-exposure baking, i.e. heat treatment after exposure to actinic rays and before development, and that the sensitivity thereof is high in respect of the productivity along with an excellent focusing depth latitude and exposure dose latitude so as to facilitate reproduction of the resist pattern with high fidelity to the mask pattern without being affected by a level difference on the substrate surface as well as insusceptibility to halation.

As a means to accomplish the above mentioned various requirements for the performance of a positive-working photoresist composition, various attempts and proposals have been made heretofore for the admixture of the composition with various kinds of specific additive compounds. For example, Japanese Patent Kokai No. 61-141441 proposes a positiveworking photoresist composition containing a trihydroxy benzophenone having improved photosensitivity and developability though without improvement in the heat resistance of the patterned resist layer. Japanese Patent Kokai No. 61-241759 proposes admixture of the photosensitive layer formed from an esterification product of o-naphthoquinonediazide sulfonic acid and a phenol novolac resin with 1 to 20% by weight of 4,4'-dimethylaminobenzophenone, 4,4'-diethylaminobenzophenone and the like as a light-absorption agent or halation inhibitor. Such a composition has a problem that no sufficient halation-preventing effect can be obtained without greatly decreasing the photosensitivity of the composition because the additive compound per se absorbs the light of the same wavelength as that of the resist layer so that fine patterning of a half-micron order or finer can hardly be accomplished with the photoresist composition. Further, Japanese Patent Kokai No. 5-11947 discloses a positive-working photoresist composition capable of exhibiting a high halation-preventing effect by the addition of a 4-aminobenzophenone compound, 2-carboxy-4-aminobenzophenone compound or a derivative thereof to a composition consisting of an alkali-soluble resin and a 1,2-naphthoquinonediazide group-containing compound. This photoresist composition has a limitation in the resolution of fine patterns with a limiting resolution of 0.5 to 0.6 μm at best not to comply with the requirements for reproduction of an extremely fine pattern.

In respect of the performance of the exposure machine, it is also a possible approach to use a lens system having a large numerical aperture by which the resolution in fine patterning could be improved. This measure, however, is not practically applicable because an increase in the numerical aperture of the lens system is necessarily accompanied by a decrease in the focusing depth latitude so that it is eagerly desired to develop a photoresist composition which is not subject to a decrease in the focusing depth latitude even by the use of a lens system of the exposure machine having a large numerical aperture.

Thus, none of the positive-working photoresist compositions in the prior art can satisfy all of the various requirements for a photoresist composition in the modern photolithographic technology.

SUMMARY OF THE INVENTION

The present invention accordingly has an object to provide a novel and improved positive-working photoresist composition capable of giving a patterned resist layer having excellent cross sectional profile of the line pattern and excellent heat resistance with high resolution in a high photosensitivity and excellent focusing depth latitude and exposure dose latitude as well as a good halation-preventing effect.

Thus, the positive-working photoresist composition of the present invention is a uniform mixture which comprises:

(a) an alkali-soluble resin as a film-forming agent;

(b) a photosensitizing agent which is an ester compound of a naphthoquinone-1,2-diazidesulfonic acid and an aromatic compound having at least one phenolic hydroxy group; and (c) from 0.1 to 6.0% by weight, based on the total amount of the components (a) and (b), of a combination of (c1) a 4,4'-bis(dialkylamino) benzophenone compound, and (c2) at least one compound selected from the group consisting of (c2-1) a first benzophenone compound represented by the general formula

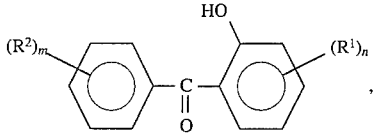

in which $R^1$ and $R^2$ are each, independently from the other, a hydroxy group or an alkoxy group having 1 to 4 carbon atoms, the subscript n is 1 or 2 and the subscript m is 0 or a positive integer not exceeding 3, (c2-2) a second benzophenone compound represented by the general formula

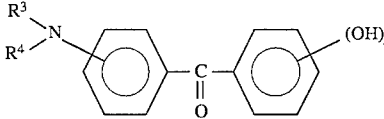

in which $R^3$ and $R^4$ are each, independently from the other, a hydrogen atom or an alkyl group having 1 to 4 carbon atoms and the subscript p is a positive integer not exceeding 3, and (c2-3) a pyrazolylazo compound represented by the general formula

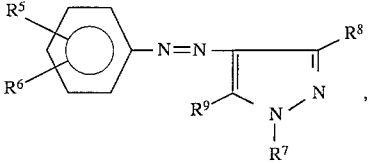

in which $R^5$ and $R^6$ are each, independently from the other, a hydrogen atom, halogen atom, hydroxy group, nitro group, carboxyl group, hydroxyalkyl group, cyano group, alkyl group having 1 to 4 carbon atoms or alkoxy group having 1 to 4 carbon atoms, $R^7$ is an aryl group, alkyl group having 1 to 4 carbon atoms or dialkylamino phenyl group, $R^8$ is a hydrogen atom or alkyl group having 1 to 4 carbon atoms and $R^9$ is a hydroxy group, amino group or group denoted by —OZ, Z being a naphthoquinone-1,2-diazidesulfonyl group, in a weight proportion of (c1) to (c2) in the range from 10:1 to 1:10 as a halation-preventing agent.

DETAILED DESCRIPTION OF THE PREFERRED EMBODIMENTS

As is described above, the most characteristic feature of the positive-working photoresist composition of the invention consists in the unique formulation of the specific additive compounds (c1) and (c2) in combination in a specified weight proportion of (c1):(c2) and in a specified total amount of (c1) plus (c2) as a halation-preventing agent to a conventional photoresist composition consisting of (a) an alkali-soluble resin and (b) a photosensitizing agent.

The alkali-soluble resin as the component (a) to serve as a film-forming agent is not particularly limitative and can be any of conventional ones. Preferably, the component (a) is selected from condensation products of an aromatic hydroxy compound such as phenol, cresol, xylenol and the like with an aldehyde compound such as formaldehyde or a ketone compound such as acetone and polyhydroxystyrenes as well as derivatives thereof.

The above mentioned aromatic hydroxy compound is exemplified by phenol, alkyl phenols such as m-, p- and o-cresols, 2,3-, 2,5-, 3,5- and 3,4-xylenols, m-, p- and o-ethyl phenols, 2,3,5-trimethyl phenol, 2,3,5-triethyl phenol, 2-, 3- and 4-tert-butyl phenols, 2-tert-butyl-4-methyl phenol, 2-tert-butyl-5-methyl phenol, alkoxy phenols such as p- and m-methoxy phenols, p- and m-ethoxy phenols, p- and m-propoxy phenols, isopropenyl phenols such as o- and p-isopropenyl phenols, 2-methyl-4-isopropenyl phenol, 2-ethyl-4-isopropenyl phenol, aryl phenols such as phenylphenols and polyhydroxy phenols such as 4,4'-dihydroxybiphenyl, bisphenol A, resorcinol, hydroquinone and pyrogallol. They can be used either singly or as a combination of two kinds or more according to need. The aromatic hydroxy compound is selected preferably from m- and p-cresols, 2,5- and 3,5-xylenols and 2,3,5-trimethyl phenol.

The above mentioned aldehyde compound to be subjected to the condensation reaction with the above mentioned phenolic compounds is not particularly limitative and can be selected from various kinds of aldehyde compounds including formaldehyde, paraformaldehyde, trioxane, acetaldehyde, propionaidehyde, butyraldehyde, trimethyl acetaldehyde, acrolein, crotonaldehyde, cyclohexane aidehyde, furrural, furyl acrolein, benzaldehyde, terephthalaldehyde, phenyl acetaldehyde, α- and β-phenyl propionaldehydes, o-, m- and p-hydroxy benzaladehydes, o-, m- and p-methyl benzaldehydes, o-, m- and p-chloro benzaladehydes, cinnamaldehyde and the like. These aldehyde compounds can be used either singly or as a combination of two kinds or more according to need although formaldehyde is preferred in respect of the availability and the cost while a combination of formaldehyde and a hydroxy benzaldehyde is preferred when an improvement is desired in the heat resistance of the patterned resist layer.

The above mentioned ketone compound is exemplified by acetone, methyl ethyl ketone, diethyl ketone and the like. They can be used either singly or as a combination of two kinds or more. A preferable combination of the aromatic hydroxy compound and a ketone compound is a combination of pyrogallol and acetone.

The synthetic procedure for the preparation of a condensation product of an aromatic hydroxy compound and an aldehyde or ketone can be performed according to a known method in the presence of an acidic catalyst such as hydrochloric acid, sulfuric acid, formic acid, acetic acid, oxalic acid, p-toluene sulfonic acid and the like. It is important, however, that the resin as prepared by the condensation reaction has a weight-average molecular weight in the range from 2000 to 25000 or, preferably, from 2500 to 20000. The weight-average molecular weight of the resin here implied can be determined by the method of gel permeation chromatography making reference to polystyrenes. It is preferable that the resin obtained by the condensation reaction is subjected to a fractionation treatment to remove the low molecular-weight fractions by the reprecipitation method. Namely, the resin as prepared is dissolved in a good solvent therefor such as an alcohol, e.g., methyl and ethyl alcohols, ketone, e.g., acetone and methyl ethyl ketone, ethyleneglycol monoethyl ether acetate, tetrahydrofuran and the like and the solution is poured into a volume of a non-solvent for the resin such as water to precipitate the resin having a relatively large molecular weight.

The above mentioned polyhydroxystyrene and derivatives thereof include a homopolymer of vinylphenol and copolymers of vinylphenol and one or more of comonomers copolymerizable therewith.

The above mentioned comonomer is exemplified by derivatives of acrylic acid, acrylonitrile, derivatives of methacrylic acid, methacrylonitrile, styrene, α-methylstyrene, o- and p-methylstyrenes, p-methoxystyrene, p-chlorostyrene and the like.

The photosensitizing agent as the component (b) in the inventive photoresist composition is an esterification product of a naphthoquinone-1,2-diazidesulfonic acid and an aromatic hydroxy compound including the esterification products of naphthoquinone-1,2-diazide-4-, -5- or -6-sulfonic acid and an aromatic hydroxy compound. The esterification product can be a partial esterification product when the aromatic hydroxy compound is a polyhydroxy compound.

The above mentioned aromatic hydroxy compound is exemplified by those belonging to the following four groups i) to iv).

i) Polyhydroxy benzophenone compounds including 2,3, 4-trihydroxy benzophenone, 2,4,4'-trihydroxy benzophenone, 2,4,6-trihydroxy benzophenone, 2,3,4,4'-tetrahydroxy benzophenone, 2,2',4,4'-tetrahydroxy benzophenone, 2,3',4,4',6-pentahydroxy benzophenone, 2,2',3,4,4'-pentahydroxy benzophenone, 2,2',3,4, 5'-pentahydroxy benzophenone, 2,3',4,5,5'-pentahydroxy benzophenone, 2,3,3',4,4',5'-hexahydroxy benzophenone and the like.

ii) Polyhydroxy aryl compounds represented by the general formula

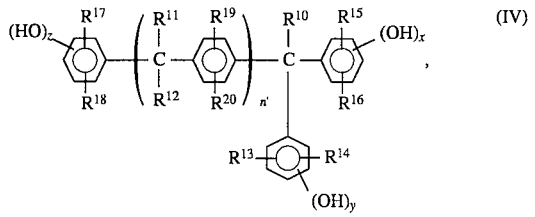

in which $R^{10}$ to $R^{12}$ are each a hydrogen atom or a lower alkyl group having, for example, 1 to 4 carbon atoms, $R^{13}$ to $R^{18}$ are each a hydrogen atom, halogen atom, lower alkyl group, lower alkoxy group, lower alkenyl group or cycloalkyl group, $R^{19}$ and $R^{20}$ are each a hydrogen atom, halogen atom or lower alkyl group, the subscripts x, y and z are each an integer of 1, 2 or 3 and the subscript n' is 0 or 1, such as tris(4-hydroxyphenyl) methane, bis(4-hydroxy-3, 5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis( 4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-3,5-dimethyl-phenyl)-2,4-dihydroxyphenyl methane, bis(4-hydroxy-2,5-dimethylphenyl)-2,4-dihydroxyphenyl methane, bis(4-hydroxy-phenyl)-3-methoxy-4-hydroxyphenyl methane, bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl) -4-hydroxyphenyl methane, bis(3-cyclohexyl-6-hydroxy-4-methylphenyl)-3,4-dihydroxyphenyl methane, 1-[1-(4hydroxyphenyl)sopropyl]-4-[1,1-bis(4-hydroxyphenyl)ethyl]benzene, 1-[1-(3-methyl-4-hydroxyphenyl)isopropyl]-4-[1,1bis(3-methyl-4-hydroxyphenyl)ethyl] benzene and the like. iii) Polyhydroxy diphenylalkane compounds represented by the general formula

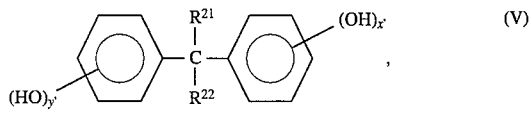

in which $R^{21}$ and $R^{22}$ are each a hydrogen atom or lower alkyl group and the subscripts x' and y' are each an integer of 1, 2 or 3, such as 2-(2,3,4-trihydroxyphenyl)-2-(2',3',4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane, bis(2,4-dihydroxyphenyl) methane and the like.

iv) Other hydroxy aromatic compounds such as phenol, p-methoxy phenol, dimethyl phenols, hydroquinone, bisphenol A, naphthol, pyrocatechol, pyrogallol monomethyl ether, pyrogallol-1,3-dimethyl ether, gallic acid and partial esterification or etherification products of gallic acid.

The quinone diazide group-containing compound as the photosensitizing agent in the photoresist composition of the invention can be prepared, for example, by the partial or complete esterification reaction of a naphthoquinone-1,2-diazide-4- or -5-sulfonyl halide with a hydroxy aromatic compound belonging to either one of the above described classes i) to iv). This condensation reaction can be performed, preferably, in a suitable organic solvent such as dioxane, N-methyl pyrrolidone, N,N-dimethyl acetamide and the like in the presence of an alkaline condensation agent such as triethanolamine, alkali carbonates, alkali hydrogencarbonates and the like. The thus obtained esterification product should have a degree of esterification of at least 50% or, preferably, at least 60% in order to obtain a high resolution of patterning with the photoresist composition. Accordingly, the esterification reaction is conducted by using the naphtho- quinone-1,2-diazide-4- or -5-sulfonyl halide in an amount of at least 0.5 mole or, preferably, at least 0.6 mole per mole of the hydroxy groups in the hydroxy aromatic compound.

It is optional that the positive-working photoresist composition of the present invention is admixed with a limited amount of an additional aromatic polyhydroxy compound selected from the polyhydroxy compounds represented by the general formula (IV) and the aromatic polyhydroxy compounds represented by the following general formula

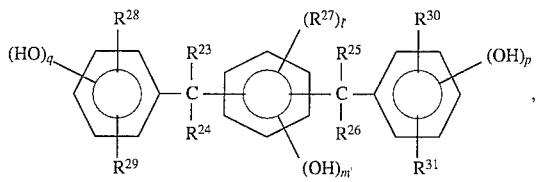

in which $R^{23}$ to $R^{26}$ are each a hydrogen atom or a lower alkyl group, $R^{27}$ to $R^{31}$ are each a hydrogen atom, halogen atom, lower alkyl group or lower alkoxy group and the subscripts l', m', p and q are each 1, 2 or 3 with the proviso that l'+m' is 4.

Examples of particularly suitable additional polyhydroxy aromatic compounds represented by the general formula (IV) include:

- bis(4-hydroxy-3,5-dimethylphenyl)-2-hydroxyphenyl methane,
- bis(4-hydroxy-2,5-dimethylphenyl)-2-hydroxyphenyl methane,
- bis(4-hydroxy-2,6-dimethylphenyl)-2-hydroxyphenyl methane,
- bis(4-hydroxy-3,5-dimethylphenyl)-3,4-dihydroxyphenyl methane,
- 1-[1-(4-hydroxyphenyl)isopropyl]-4-[1,1-bis(4-hydroxyphenyl) ethyl]benzene, 1-[1-(3-methyl-4-hydroxyphenyl)isopropyl]-4-[1,1-bis(3-methyl-4-hydroxyphenyl)ethyl]benzene and the like;

and examples of the compounds represented by the general formula (VI) include:

- 2,6-bis[1-(2,4-dihydroxyphenyl)isopropyl]-4-methyl phenol,
- 4,6-bis[1-(4-hydroxyphenyl)isopropyl]resorcin, 4,6-bis(3,5-dimethoxy-4-hydroxyphenylmethyl) pyrogallol, 4,6-bis(3,5-dimethyl-4-hydroxyphenylmethyl) pyrogallol, 2,6-bis(3-methyl-4,6-dihydroxyphenylmethyl)-4-methyl phenol, 2,6-bis(2,3,4-trihydroxyphenylmethyl)-4-methyl phenol and the like.

When these additional aromatic polyhydroxy compounds are added to the inventive photoresist composition, the amount thereof is in the range from 5 to 50% by weight or, preferably, from 10 to 35% by weight based on the alkali-soluble resin as the component (a).

The amount of the photosensitizing agent as the component (b) in the inventive photoresist composition is in the range from 5 to 100% by weight or, preferably, from 10 to 50% by weight based on the amount of the alkali-soluble resinous ingredient as the component (a) or based on the total amount of the component (a) and the above described optional additional hydroxy aromatic compound, when used. When the amount of the component (b) is too small, a decrease is caused in the pattern reproducibility not to give a reproduced pattern having high fidelity to the mask pattern while, when the amount thereof is too large, the uniformity of the resist layer is decreased to cause a decrease in the resolution of the pattern.

As the most characteristic feature of the inventive photoresist composition, the composition consisting of the above described components (a) and (b) is further admixed with a halation-preventing agent which is a combination of the components (c1) and (c2) defined above in a specified weight proportion.

The component (c1) is a 4,4'-bis(dialkylamino) benzophenone compound, of which the alkyl group has 1 to 4 carbon atoms, exemplified by 4,4'-bis(dimethylamino)benzophenone, 4,4'-bis(diethylamino) benzophenone, 4,4'-bis(di-n-propylamino)benzophenone, 4,4'-bis(diisopropylamino) benzophenone, 4,4'-bis(dibutylamino) benzophenone, 4-dimethylamino-4'-diethylaminobenzopheno 4,4'-bis(N-ethyl-N-methylamino)-benzophenone and the like. These compounds can be used either singly or as a combination of two kinds or more according to need. Preferably, the component (c1) is selected from 4,4'-bis(dimethylamino )benzophenone and 4,4'-bis(diethylamino) benzophenone.

The component (c2) is selected from the compounds belonging to three classes of the components (c2-1), (c2-2) and (c2-3) represented by the general formulas (I), (II) and (III), respectively. These compounds can be used as a combination of two kinds or more according to need.

The component (c2-1) as the first class of the component (c2) is a hydroxybenzophenone compound represented by the general formula (I) and is exemplified by 2,3,4-, 2,4,4'-, 2,4,5- and 2,4,6-trihydroxy benzophenones, 2,2',3,4-, 2,3,4,4'- and 2,2',4,4'-tetrahydroxy benzophenones, 2,2',3,4,4'- and 2,3',4,4',6-pentahydroxy benzophenones, 2,3',4,5,5',6- and 2,3,3',4,4',5'-hexahydroxy benzophenones, 2-hydroxy-4-methoxy benzophenone, 2,2'-dihydroxy-4,4'dimethoxy benzophenone and the like. These compounds can be used as a combination of two kinds or more according to need. These benzophenone compounds exhibit excellent halation-preventing effect by virtue of their light-absorbing characteristics and are also advantageous in respect of the high photosensitivity and good exposure dose latitude of the photoresist composition. Preferably, the component (c2-1) is selected from 2,4,5-trihydroxy benzophenone, 2,3,4,4'- and 2,2',4,4'-tetrahydroxy benzophenones, 2,2',3,4,4'-pentahydroxy benzophenone, 2,3,3',4,4',5'-hexahydroxy benzophenone and 2,2'-dihydroxy-4,4'-dimethoxy benzophenone, among which 2,2',4,4'-tetrahydroxy benzophenone is particularly preferable.

The component (c2-2) as the second class of the component (c2) is a benzophenone compound having hydroxy and amino groups represented by the general formula (II) and is exemplified by 4-amino-2'-hydroxy benzophenone, 4-amino-4'-hydroxy benzophenone, 4-dimethylamino-2'-hydroxy benzophenone, 4-dimethylamino-4'-hydroxy benzophenone, 4-diethylamino-2'-hydroxy benzophenone, 4-diethylamino-4'-hydroxy benzophenone, 4-dimethylamino-2',4'-dihydroxy benzophenone, 4-diethylamino-2',4'-dihydroxy benzophenone, 4-amino-2',4',6'-trihydroxy benzophenone, 4-dimethylamino-2',4',6'-trihydroxy benzophenone, 6-dimethylamino-2',4',6'-trihydroxy benzophenone and the like. These compounds can be used as a combination of two kinds or more according to need. These benzophenone compounds exhibit excellent halation-preventing effect by virtue of their light-absorbing characteristics and are also advantageous in respect of the high photosensitivity and good exposure dose latitude of the photoresist composition. The component (c2-2) is preferably selected from 4-dialkylamino-2'-hydroxy benzophenones such as 4-dimethylamino-2'-hydroxy benzophenone and 4-diethylamino-2'-hydroxy benzophenone and 4-dialkylamino-2',4'-dihydroxy benzophenones such as 4-dimethylamino-2',4'-dihydroxy benzophenone and 4-diethylamino-2',4'-dihydroxy benzophenone.

The component (c2-3) as the third class of the component (c2) is a pyrazolylazo compound represented by the general formula (III) including 4-phenylazo-5-aminopyrazole compounds, 4-phenylazo-5-hydroxypyrazole compounds and 4-phenylazo-5-(naphthoquinone-1,2-diazidesulfonyloxy) pyrazole compounds.

Examples of the 4-phenylazo-5-aminopyrazole compound include 5-amino-1-phenyl-4-phenylazopyrazole, 5-amino-3-methyl-1-phenyl-4-phenylazopyrazole, 5-amino-3-methyl-1-phenyl-4-(4-hydroxyphenylazo) pyrazole, 5-amino-3-methyl-1-phenyl-4-(2-hydroxyphenylazo) pyrazole, 5-amino-3-methyl-1-phenyl-4-(4-carboxyphenylazo) pyrazole, 5-amino-3-methyl-1-phenyl-4-(3-carboxyphenylazo)pyrazole, 5-amino-3-methyl-1-phenyl- 4-[4-(2-hydroxyethyl)phenylazo]pyrazole, 5-amino-1-ethyl-3-methyl-4-(4-nitrophenylazo) pyrazole, 5-amino-3-methyl-1-phenyl-4-(4-hydroxy-2-nitrophenylazo)pyrazole, 5-amino-3-methyl-1-phenyl-4-(4-chloro-2-methylphenylazo) pyrazole, 5-amino-3-methyl-1-phenyl-4-(4-cyanophenylazo)pyrazole, 5-amino-3-methyl-1-phenyl-4-(4-ethoxyphenylazo) pyrazole, 5-amino-3-dimethylaminophenyl-4-phenylazopyrazole and the like.

Examples of the 4-phenylazo-5-hydroxypyrazole compound include 1-phenyl-4-phenylazo-5-hydroxypyrazole, 3-methyl-1-phenyl-4-phenylazo-5-hydroxypyrazole, 1-phenyl-4-(2,5-dichlorophenylazo)-5-hydroxypyrazole, 1-ethyl-3-methyl-4-(4-chloro-2-methylphenylazo)-5-hydroxypyrazole, 3-methyl-1-p-tolyl-4-(3-nitrophenylazo)-5-hydroxypyrazole, 3-methyl-1-p-tolyl-4-[4-(2-hydroxyethyl)phenylazo]-5-hydroxypyrazole, 3-methyl-1-p-tolyl-4-(2-methoxy-4-nitrophenylazo)-5-hydroxypyrazole, 3-ethyl-1-phenyl-4-(4-methoxy-2-nitrophenylazo)-5-hydroxypyrazole, 3-methyl-1-phenyl-4-(4-chloro-2-nitrophenylazo)-5-hydroxypyrazole, 1-p-dimethylaminophenyl-3-methyl-4-phenylazo-5-hydroxypyrazole, 1-p-dimethylaminophenyl-3-methyl-4-(4-methyl-2-chlorophenylazo)-5-hydroxypyrazole, 1-p-dimethylaminophenyl-3-methyl-4-(4-methyl-2-nitrophenylazo)-5-hydroxypyrazole, 1-phenyl-4-(4-methoxyphenylazo)-5-hydroxypyrazole, C. I. Solvent Yellow 16, C. I. Solvent Yellow 21 and the like.

Examples of the 4-phenylazo-5-(naphthoquinone-1,2-diazidesulfonyloxy) pyrazole compound include those obtained from the above mentioned 4-phenylazo-5-hydroxypyrazole compound by the esterieication of the hydroxy group at the 5-position thereof with a naphthoquinone-1,2-diazidesulfonic acid such as naphthoquinone-1,2-diazide-4- and -5-sulfonic acids. These pyrazolylazo compounds can be used either singly or as a combination of two kinds or more according to need. The compounds as the component (c2-3) not only act as a light-absorbing agent but also serve to improve the contrast of the resist pattern and further have an effect to greatly improve the stability of the resist pattern in the configuration and dimensions.

Examples of particularly preferable pyrazolylazo compounds as the component (c2-3) include 5-amino-3-methyl-1-phenyl-4-(4-carboxyphenylazo)pyrazole, 5-amino-3-methyl-1-phenyl-4-(3-carboxyphenylazo) pyrazole, 5-amino-3-methyl-1-phenyl-4-(4-hydroxyphenylazo) pyrazole, 3-methyl-1-p-tolyl-4-(3-nitrophenylazo)-5-hydroxypyrazole and 3-methyl-1-p-tolyl-4-[4-(2-hydroxyethyl)phenylazo]-5-hydroxypyrazole.

The amount of the component (c) as a halation-preventing agent in the inventive photoresist composition, which is a combination of the components (c1) and (c2), is in the range from 0.1 to 6.0% by weight or, preferably, from 0.5 to 3.0% by weight based on the total amount of the alkali-soluble resin as the component (a) and the naphthoquinone-1,2-diazidesulfonyl group-containing compound is the component (b). When the amount of the component (c) is too small, the desired halation-preventing effect cannot be exhibited as a matter of course while, when the amount thereof is too large, a decrease is caused in the photosensitivity of the photoresist composition and resolution of the pattern reproduction.

It is essential that the component (c) as a halationpreventing agent in the inventive photoresist composition is a combination of the components (c1) and (c2) in a weight proportion in the range from 1:10 to 10:1 or, preferably, from 1:10 to 2:1. When the proportion is outside of this range, the desired halation-preventing effect cannot be fully exhibited and the photosensitivity of the composition is decreased. In particular, the component (c1) has an effect of decreasing the photosensitivity of the composition so that it is preferable that the amount of the component (c1) taken alone does not exceed 1.7% by weight or, more preferably, does not exceed 1.2% by weight based on the total amount of the components (a) and (b). As is understood from the results of the Examples described later, it is an advantageous way that the weight proportion of the component (c1) to (c2) is somewhat increased when the total amount of the components (c1) and (c2) is relatively small and vice versa.

It is of course optional that the photoresist composition of the invention comprising the above described components (a), (b) and (c) is further admixed with various kinds of known additives having compatibility with the essential ingredients including auxiliary resins, plasticizers and stabilizers to improve the properties of the resist film and coloring agents to improve the visibility of the patterned resist layer formed by development each in a limited amount. It is of course that the photoresist composition of the invention is used in the form of a solution prepared by dissolving the essential and optional ingredients in an organic solvent.

Examples of suitable organic solvents include ketones such as acetone, methyl ethyl ketone, cyclohexanone and methyl isoamyl ketone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as ethers thereof, e.g., monomethyl ethers, monoethyl ethers, monopropyl ethers, monobutyl ethers and monophenyl ethers, cyclic ethers such as dioxane, and esters such as ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

Following is a typical procedure for the photolithographic patterning work by using the positive-working photo-resist composition of the present invention. Namely, the surface of a substrate such as a semiconductor silicon wafer is uniformly coated with the photoresist composition in the form of a solution as prepared in the above described manner by using a suitable coating machine such as spin coaters to form a resist layer which is exposed pattern-wise through a patterned photomask to ultra-violet light emitted from a suitable light source such as low-, high- and ultrahigh-pressure mercury lamps, arc lamps, xenon lamps and the like or irradiated with electron beams under pattern-wise scanning to form a latent image of the pattern with high photosensitivity followed by development thereof with a weakly alkaline aqueous solution, such as a 1 to 10% by weight aqueous solution of tetramethyl ammonium hydroxide, as a developer so that the resist layer in the areas exposed to the actinic rays is dissolved away leaving a patterned resist layer with high fidelity to the mask pattern.

The thus obtained patterned resist layer is advantageous in respect of the high resolution to ensure ultra-fine patterning, high heat resistance and ideally orthogonal cross sectional profile of the line pattern. In particular, the latitudes for the focusing depth and exposure dose with the inventive photoresist composition are so large that quite satisfactory patterning can be accomplished even on a substrate surface having level differences or having protrusions and recesses or having a high reflectivity to the actinic rays to be useful in the manufacture of ICs and VLSIs.

In the following, the positive-working photoresist composition of the present invention is described in more detail by way of examples which, however, never limit the scope of the invention in any way. In the following examples, the photoresist compositions prepared therein were evaluated for the following items in a procedure respectively described there. The term of "parts" in the following always refers to "parts by weight".

(1) Photosensitivity

A semiconductor silicon wafer was uniformly coated with the photoresist composition on a spinner followed by drying at 110° C. for 90 seconds to form a resist layer having a film thickness of 1.05 µm. The resist layer was pattern-wise exposed to ultra-violet light through a test pattern mask on a minifying projection exposure machine (Model NSR-1755i7B, manufactured by Nikon Co., NA=0.54) for a length of time increased stepwise from 100 mseconds with a 10 mseconds increment up to several hundreds mseconds followed by a development treatment in a 2.38% by weight aqueous solution of tetramethyl ammonium hydroxide at 23° C. for 60 seconds and subsequent rinse in running water for 30 seconds before drying. The minimum exposure time in mseconds, which was sufficient for the complete removal of the resist layer in the exposed areas by the development treatment, was recorded as a measure of the photosensitivity of the photoresist composition.

(2) Resolution

A test patterning work was conducted in the same manner as in the measurement of the photosensitivity described above but at an exposure dose, by which a line-and-space pattern of 0.40 µm width could be reproduced to give a pattern with a line:space width ratio of 1:1, and the minimum width of the line-and-space pattern which could be resolved in the reproduced pattern was recorded as the critical resolution at the exposure dose for the reproduction of the mask pattern.

(3) Heat Resistance

A silicon semiconductor wafer on which a patterned resist layer with a line pattern of 5 µm width was formed was subjected to a baking treatment for 5 minutes on a hot plate at 130° C., 135° C. or 140° C. and records were made for the lowest temperature at which deformation in the patterned resist layer could be detected.

(4) Cross Sectional Profile of Line Pattern

A cross section of a silicon semiconductor wafer on which a patterned resist layer with a line pattern of 0.40 µm width was formed was examined on a scanning electron microscopic photograph for the cross sectional profile of the line pattern and the results were recorded by the ratings of A and B for an orthogonal profile and for a trapezoidal profile, respectively.

(5) Focusing Depth Latitude

Test exposure was conducted at the exposure dose Eop required for the reproduction of a line-and-space pattern of 0.40 µm width in a 1:1 line:space width ratio on a minifying projection exposure machine (Model NSR-1755i7B, manufactured by Nikon Co., NA=0.54) by slightly displacing the focus point up and down and the cross sectional profiles of the line patterns of 0.40 µm width by the development treatment were examined on a scanning electron microscopic photograph. Recording was made for the largest displacement of the focus point in µm by which a line pattern of 0.40 µm width with an orthogonal cross section could be obtained.

(6) Exposure Dose Latitude

The exposure dose latitude was given by the ratio of Eop:Eth, of which Eop has the meaning defined above and Eth is the exposure dose by which the resist layer after exposure could be completely removed by the development treatment. A larger value of this ratio means a larger exposure dose latitude.

(7) Halation-Preventing Effect

A photoresist layer having a film thickness of 1.5 µm was formed on a fused quartz glass plate and irradiated with ultraviolet light on an ultraviolet exposure machine (Model PLA-501F, manufactured by Canon Co.) for 30 seconds in an illuminance of 10 mW/cm$^2$. The value of a parameter B expressed by the equation $$B = (-1/d) \ln T^\infty,$$

in which $T^\infty$ is the light transmission of the resist layer after the ultra-violet irradiation at a wavelength of 365 nm and d is the thickness of the resist layer in µm, was calculated and recorded as a measure of the halation-preventing effect. The results were recorded in three ratings of A, B and C for the values of the parameter B of at least 0.5 as A, at least 0.25 but smaller than 0.5 as B and smaller than 0.25 as C.

EXAMPLE 1

A cresol novolac resin was prepared by the condensation reaction of a 36:64 by weight mixture of m- and p-cresols and formalin in the presence of oxalic acid as the catalyst followed by a fractionating treatment to remove the low molecular-weight fractions so that the resultant novolac resin had a weight-average molecular weight of 5000.

A positive-working photoresist composition was prepared by dissolving, in 400 parts of a 9:1 by weight mixture of ethyl lactate and butyl acetate, i) 100 parts of the above obtained cresol novolac resin, ii) 13 parts of an esterification product of 1.0 mole of bis(5-cyclohexyl-4-hydroxy-2-methylphenyl)-3,4-dihydroxyphenyl methane with 2.0 moles of naphthoquinone-1,2-diazide-5-sulfonyl chloride, iii) 24 parts of an esterification product of 1.0 mole of bis(5-cyclohexyl-4-hydroxy-2-methylphenyl)-3,4-dihydroxyphenyl methane with 3.0 moles of naphthoquinone-1,2-diazide-5-sulfonyl chloride, iv) 23 parts of 1,3-dihydroxy-4,6-bis[α-methyl-α-(4hydroxyphenyl)ethyl]benzene, and v) 1.6 parts of 1,3,5-tris(4-tert-butyl-3-hydroxy-2,6-dimethylbenzyl) isocyanurate, with further admixture of 0.6% by weight, based on the total amount of the ingredients i) to iii) above, of a 2:1 by weight mixture of (c1) 4,4'-bis(diethylamino) benzophenone and (c2) 2,2',4,4'-tetrahydroxy benzophenone, to give a solution which was filtered through a membrane filter of 0.2 µm pore diameter.

The results of the evaluation tests for the thus prepared photoresist composition are shown in Table 1 below.

EXAMPLES 2 TO 5

The formulation of the positive-working photoresist composition in each of Examples 2, 3, 4 and 5 was substantially the same as in Example 1 except that the mixing ratio of the ingredient (c1) to (c2) was 1:1, 1:2, 1:5 and 3:2, respectively, instead of 2:1 and the amount of the mixture of the ingredients (c1) and (c2) was 1.8%, 3.5%, 5.3% and 2.4%, respectively, by weight instead of 0.6% by weight.

The results of the evaluation tests of these photoresist compositions are shown in Table 1.

COMPARATIVE EXAMPLE 1

The formulation of the positive-working photoresist composition was substantially the same as in Example 1 excepting omission of the ingredients (c1) and (c2).

The results of the evaluation tests of this photoresist composition are shown in Table 1.

COMPARATIVE EXAMPLE 2

The formulation of the positive-working photoresist composition was substantially the same as in Example 1 excepting omission of the ingredient (c2) and addition of the ingredient (c1) alone in an amount of 1.8% by weight based on the total amount of the ingredients i) to iii).

The results of the evaluation tests of this photoresist composition are shown in Table 1.

COMPARATIVE EXAMPLE 3

The formulation of the positive-working photoresist composition was substantially the same as in Example 1 excepting omission of the ingredient (c1) and addition of the ingredient (c2) alone in an amount of 4.7% by weight based on the total amount of the ingredients i) to iii).

The results of the evaluation tests of this photoresist composition are shown in Table 1.

EXAMPLES 6 TO 9

The formulation of the positive-working photoresist composition in each of Examples 6, 7, 8 and 9 was substantially the same as in Example 1 except that 2,2',4,4'-tetrahydroxy benzophenone as the ingredient (c2) was replaced with 4-dimethylamino-2',4'-dihydroxy benzophenone, the weight ratio of the ingredient (c1) to (c2) was 1:1, 2:1, 1:2 and 1:5, respectively, and the total amount of the ingredients (c1) and (c2) was 0.9%, 1.8%, 3.0% and 4.7%, respectively, by weight based on the total amount of the ingredients i) to iii).

The results of the evaluation tests of these photoresist compositions are shown in Table 1.

COMPARATIVE EXAMPLE 4

The formulation of the positive-working photoresist composition was substantially the same as in Example 6 excepting omission of the ingredient (c1) and addition of the ingredient (c2), i.e. 4-dimethylamino-2',4'-dihydroxy benzophenone, alone in an amount of 5.3% by weight based on the total amount of the ingredients i) to iii).

The results of the evaluation tests of this photoresist composition are shown in Table 1.

EXAMPLES 10 TO 13

The formulation of the positive-working photoresist composition in each of Examples 10, 11, 12 and 13 was substantially the same as in Example 1 except that 2,2',4,4'-tetrahydroxy benzophenone as the ingredient (c2) was replaced with 5-amino-3-methyl-1-phenyl-4-(4-hydroxyphenylazo) pyrazole, the weight ratio of the ingredient (c1) to (c2) was 2:1, 7:10, 3:10 and 1:10, respectively, and the total amount of the ingredients (c1) and (c2) was 0.6%, 2.4%, 4.1% and 5.3%, respectively, by weight based on the total amount of the ingredients i) to iii).

The results of the evaluation tests of these photoresist compositions are shown in Table 1.

COMPARATIVE EXAMPLE 5

The formulation of the positive-working photoresist composition was substantially the same as in Example 10 excepting omission of the ingredient (c1) and addition of the ingredient (c2), i.e. 5-amino-3-methyl-1-phenyl-4-(4-hydroxyphenylazo) pyrazole, alone in an amount of 5.3% by weight based on the total amount of the ingredients i) to iii).

The results of the evaluation tests of this photoresist composition are shown in Table 1.

TABLE 1

| | Photo-sensitivity, ms | Resolution, μm | Heat resistance, °C. | Cross sectional profile | Focusing depth latitude, μm | Exposure dose latitude | Halation-preventing effect |
|---|---|---|---|---|---|---|---|
| Example | | | | | | | |
| 1 | 200 | 0.32 | 135 | A | 1.4 | 1.90 | B |
| 2 | 230 | 0.35 | 135 | A | 1.3 | 1.95 | B |
| 3 | 260 | 0.35 | 135 | A | 1.2 | 1.95 | A |
| 4 | 290 | 0.38 | 135 | A | 1.0 | 2.00 | A |
| 5 | 280 | 0.35 | 135 | A | 1.2 | 1.95 | A |
| 6 | 210 | 0.32 | 135 | A | 1.4 | 1.90 | B |
| 7 | 260 | 0.35 | 135 | A | 1.3 | 1.95 | B |
| 8 | 250 | 0.35 | 135 | A | 1.2 | 1.95 | A |
| 9 | 280 | 0.38 | 135 | A | 1.0 | 2.00 | A |
| 10 | 200 | 0.32 | 135 | A | 1.4 | 1.90 | B |
| 11 | 250 | 0.35 | 135 | A | 1.3 | 1.95 | A |
| 12 | 270 | 0.35 | 135 | A | 1.2 | 1.95 | A |
| 13 | 280 | 0.38 | 135 | A | 1.0 | 2.00 | A |

TABLE 1-continued

| | Photo-sensitivity, ms | Resolution, μm | Heat resistance, °C. | Cross sectional profile | Focusing depth latitude, μm | Exposure dose latitude | Halation-preventing effect |
|---|---|---|---|---|---|---|---|
| Comparative Example | | | | | | | |
| 1 | 170 | 0.35 | 135 | A | 1.4 | 1.85 | C |
| 2 | 310 | 0.35 | 135 | B | 1.2 | 1.95 | B |
| 3 | 270 | 0.40 | 135 | A | 0.8 | 1.90 | A |
| 4 | 290 | 0.40 | 135 | A | 0.8 | 1.90 | A |
| 5 | 280 | 0.40 | 135 | A | 0.8 | 1.90 | A |

What is claimed is:

1. A positive-working photoresist composition which comprises, as a uniform mixture:

(a) an alkali-soluble resin as a film-forming agent;

(b) a photosensitizing agent which is an ester compound of a naphthoquinone-1,2-diazidesulfonic acid and an aromatic compound having at least one phenolic hydroxy group; and (c) from 0.5 to 3.0% by weight, based on the total amount of the components (a) and (b), of a combination of (c1) a 4,4'-bis(dialkylamino)benzophenone compound, and (c2) at least one compound selected from the group consisting of (c2-1) a first benzophenone compound represented by the general formula

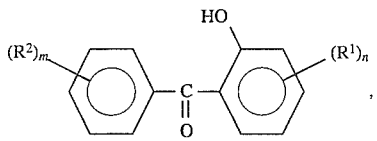

in which $R^1$ and $R^2$ are each, independently from the other, a hydroxy group or an alkoxy group having 1 to 4 carbon atoms, the subscript n is 1 or 2 and the subscript m is 0 or a positive integer not exceeding 3, (c2-2) a second benzophenone compound represented by the general formula

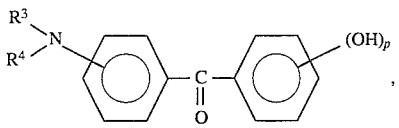

in which $R^3$ and $R^4$ are each, independently from the other, a hydrogen atom or an alkyl group having 1 to 4 carbon atoms and the subscript p is a positive integer not exceeding 3, and (c2-3) a pyrazolylazo compound represented by the general formula

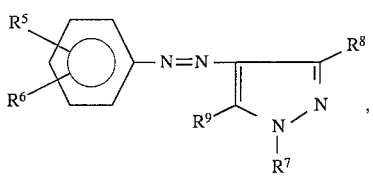

in which $R^5$ and $R^6$ are each, independently from the other, a hydrogen atom, halogen atom, hydroxy group, nitro group, carboxyl group, hydroxyalkyl group, cyano group, alkyl group having 1 to 4 carbon atoms or alkoxy group having 1 to 4 carbon atoms, $R^7$ is an aryl group, alkyl group having 1 to 4 carbon atoms or dialkylamino phenyl group, $R^8$ is a hydrogen atom or alkyl group having 1 to 4 carbon atoms and $R^9$ is a hydroxy group, amino group or group denoted by —OZ, Z being a naphthoquinone-1,2-diazidesulfonyl group, in a weight proportion of (c1) to (c2) in the range from 10:1 to 1:10 as a halation-preventing agent.

2. The positive-working photoresist composition as claimed in claim 1 in which the alkali-soluble resin as the component (a) is an alkali-soluble novolac resin which is a condensation product of an aromatic hydroxy compound and formaldehyde.

3. The positive-working photoresist composition as claimed in claim 2 in which the aromatic hydroxy compound is selected from the group consisting of m-cresol, p-cresol, 2,5-xylenol, 3,5-xylenol and 2,3,5-trimethyl phenol.

4. The positive-working photoresist composition as claimed in claim 1 in which the amount of the photosensitizing agent as the component (b) is in the range from 5 to 100% by weight based on the amount of the alkali-soluble resin as the component (a).

5. The positive-working photoresist composition as claimed in claim 1 in which the 4,4'-bis(dialkylamino) benzophenone compound as the component (c1) is 4,4'-bis(dimethylamino) benzophenone or 4,4'-bis(diethylamino) benzophenone.

6. The positive-working photoresist composition as claimed in claim 1 in which the first benzophenone compound as the component (c2-1) is selected from the group consisting of 2,4,5-trihydroxy benzophenone, 2,3,4,4'-tetrahydroxy benzophenone, 2,2',4,4'-tetrahydroxy benzophenone, 2,2',3,4,4'-pentahydroxy benzophenone, 2,3,3',4,4',5'-hexahydroxy benzophenone, 2,2'-dihydroxy-4,4'-dimethoxy benzophenone.

7. The positive-working photoresist composition as claimed in claim 6 in which the first benzophenone compound as the component (c2-1) is 2,2',4,4'-tetrahydroxy benzophenone.

8. The positive-working photoresist composition as claimed in claim 1 in which the second benzophenone compound as the component (c2-2) is selected from the group consisting of 4-dialkylamino-2'-hydroxy benzophenones and 4-dialkylamino-2',4'-dihydroxy benzophenones.

9. The positive-working photoresist composition as claimed in claim 1 in which the pyrazolylazo compound as the component (c2-3) is selected from the group consisting of 5-amino-3-methyl-1-phenyl-4-(4-carboxyphenylazo) pyrazole, 5-amino-3-methyl-1-phenyl-4-(3-carboxyphenylazo) pyrazole, 5-amino-3-methyl-1-phenyl-4-(4-hydroxyphenylazo) pyrazole, 3-methyl-1-p-tolyl-4-(3-nitrophenylazo)-5-hydroxy pyrazole and 3-methyl-1-p-tolyl-4-(4-hydroxyethylphenylazo)-5-hydroxy pyrazole.

10. The positive-working photoresist composition as claimed in claim 1 in which the weight proportion of the component (c1) to the component (c2) is in the range from 1:10 to 2:1.

11. The positive-working photoresist composition as claimed in claim 1 in which the amount of the component (c1) does not exceed 1.7% by weight based on the total amount of the components (a) and (b).

* * * * *